US008618619B1

(12) United States Patent
Miks et al.

(10) Patent No.: US 8,618,619 B1
(45) Date of Patent: Dec. 31, 2013

(54) TOP PORT WITH INTERPOSER MEMS MICROPHONE PACKAGE AND METHOD

(75) Inventors: Jeffrey Alan Miks, Chandler, AZ (US); Louis B. Troche, Jr., Gilbert, AZ (US)

(73) Assignee: Amkor Technology, Inc.

( * ) Notice: Subject to any disclaimer, the term of this patent is extended or adjusted under 35 U.S.C. 154(b) by 225 days.

(21) Appl. No.: 13/016,343

(22) Filed: Jan. 28, 2011

(51) Int. Cl.
*H01L 27/14* (2006.01)
*H01L 21/00* (2006.01)

(52) U.S. Cl.
USPC .......................... 257/414; 438/51; 257/E21.5

(58) Field of Classification Search
USPC .............. 381/361, 355; 257/414–417, E21.5, 257/E21.499; 438/48, 51
See application file for complete search history.

(56) References Cited

U.S. PATENT DOCUMENTS

| | | | |
|---|---|---|---|
| 4,525,817 A | 6/1985 | Takuya | |
| 6,522,762 B1 | 2/2003 | Mullenborn et al. | |
| 6,781,231 B2 | 8/2004 | Minervini | |
| 6,862,002 B2 | 3/2005 | Demicco et al. | |
| 7,132,307 B2 | 11/2006 | Wang et al. | |
| 7,166,910 B2 | 1/2007 | Minervini | |
| 7,242,089 B2 | 7/2007 | Minervini | |
| 7,381,589 B2 | 6/2008 | Minervini | |
| 7,382,048 B2 | 6/2008 | Minervini | |
| 7,434,305 B2 | 10/2008 | Minervini | |
| 7,439,616 B2 | 10/2008 | Minervini | |
| 7,501,703 B2 | 3/2009 | Minervini | |
| 7,537,964 B2 | 5/2009 | Minervini | |
| 8,018,049 B2 | 9/2011 | Minervini | |
| 2003/0035558 A1 | 2/2003 | Kawamura et al. | |
| 2004/0184632 A1 | 9/2004 | Minervini | |

(Continued)

FOREIGN PATENT DOCUMENTS

| | | |
|---|---|---|
| JP | 2000-307164 | 11/2000 |
| JP | 2002-057482 | 2/2002 |
| JP | 2010-187277 | 8/2010 |

OTHER PUBLICATIONS

Gabriel, K., "Akustica", Sep. 29, 2005, 46 pages, Akustica, Inc., Pittsburgh, PA, USA.
"Infineone® -SMM310® Silicon MEMS Microphone", Product Brief, 2007, 2 pages, Infineon Technologies AG, Munich, Germany. No author provided.
"Surface Mount MEM's Microphones", 2 pages. Retrieved on Apr. 28, 2010 from the Internet: <URL:http://www.knowles.com/search/product.htm?x_sub_cat_id=3>. No author provided.

(Continued)

*Primary Examiner* — Daniel Luke
*Assistant Examiner* — Khaja Ahmad
(74) *Attorney, Agent, or Firm* — McAndrews, Held & Malloy, Ltd.

(57) ABSTRACT

A top port MEMS package includes a substrate and an interposer mounted to the substrate. The interposer includes an interposer aperture and an interposer channel fluidly coupled to the interposer aperture. A MEMS electronic component is mounted to the interposer above the interposer aperture. A top port lid includes a top port and a chimney structure fluidly coupling to the top port to the interposer channel. A front volume including the top port, the flue, the interposer channel, and the interposer aperture is acoustically sealed from a relatively large back volume defined by a lid cavity of the top port lid. By acoustically sealing the front volume from the back volume and further by maximizing the back volume, the noise to signal ratio is minimized thus maximizing the sensitivity of top port MEMS microphone package as well as the range of applications.

20 Claims, 12 Drawing Sheets

(56) References Cited

U.S. PATENT DOCUMENTS

| | | |
|---|---|---|
| 2006/0157841 A1 | 7/2006 | Minervini |
| 2007/0082421 A1 | 4/2007 | Minervini |
| 2007/0201715 A1 | 8/2007 | Minervini |
| 2007/0202627 A1 | 8/2007 | Minervini |
| 2007/0215962 A1 | 9/2007 | Minervini et al. |
| 2008/0150111 A1 | 6/2008 | Hiller et al. |
| 2009/0057876 A1 | 3/2009 | Chien et al. |
| 2010/0086164 A1* | 4/2010 | Gong et al. .................. 381/369 |
| 2010/0119097 A1 | 5/2010 | Ohtsuka |
| 2010/0128914 A1* | 5/2010 | Khenkin ....................... 381/361 |
| 2010/0142743 A1* | 6/2010 | Tanaka et al. ................. 381/346 |
| 2010/0202649 A1* | 8/2010 | Inoda et al. ................... 381/361 |
| 2011/0156176 A1* | 6/2011 | Huckabee et al. ............ 257/414 |

OTHER PUBLICATIONS

Syed et al., "Top Port MEMS Microphone Package and Method", U.S. Appl. No. 12/834,682, filed Jul. 12, 2010.

Kuo et al., "Stacked and Staggered Die MEMS Package and Method", U.S. Appl. No. 13/046,071, filed Mar. 11, 2011.

Kuo et al., "Metal Mesh Lid MEMS Package and Method", U.S. Appl. No. 13/096,359, filed Apr. 28, 2011.

* cited by examiner

US 8,618,619 B1

TOP PORT WITH INTERPOSER MEMS MICROPHONE PACKAGE AND METHOD

TECHNICAL FIELD

The present application relates to the field of electronics, and more particularly, to methods of forming electronic component packages and related structures.

BACKGROUND

A Micro Electro Mechanical Systems (MEMS) microphone electronic component includes a moveable compliant diaphragm and a rigid perforated backplate on a silicon substrate. The diaphragm and backplate form a capacitor. As sound waves move the diaphragm, the capacitance between the diaphragm and backplate changes. The capacitance variations are converted into an electrical signal. In this manner, sound waves are converted into an electrical signal.

To optimize the sensitivity of the MEMS microphone electronic component, it is ideal to have an acoustic seal between the front volume, defined by the space wherein the sound source and the front of the diaphragm belong, and the back volume, defined by the space behind the diaphragm.

BRIEF DESCRIPTION OF THE DRAWINGS

In the following description, the same or similar elements are labeled with the same or similar reference numbers.

DETAILED DESCRIPTION

Figure 1:
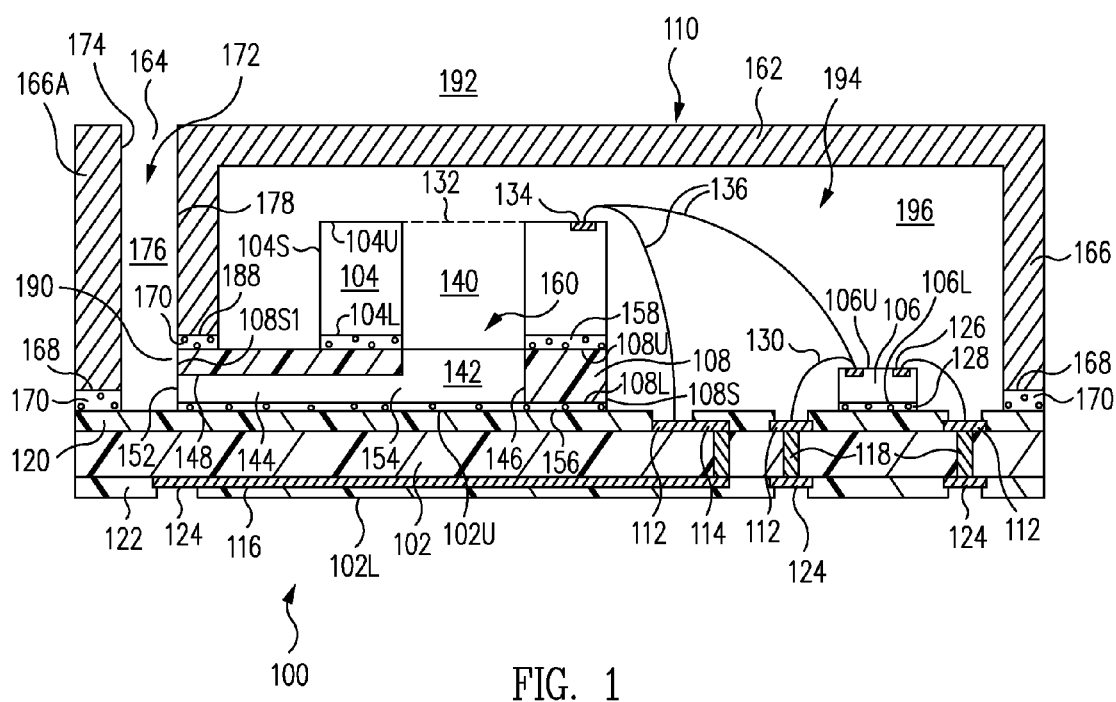
FIG. 1 is a cross-sectional view of a top port MEMS microphone package in accordance with one embodiment.
Figure 2:
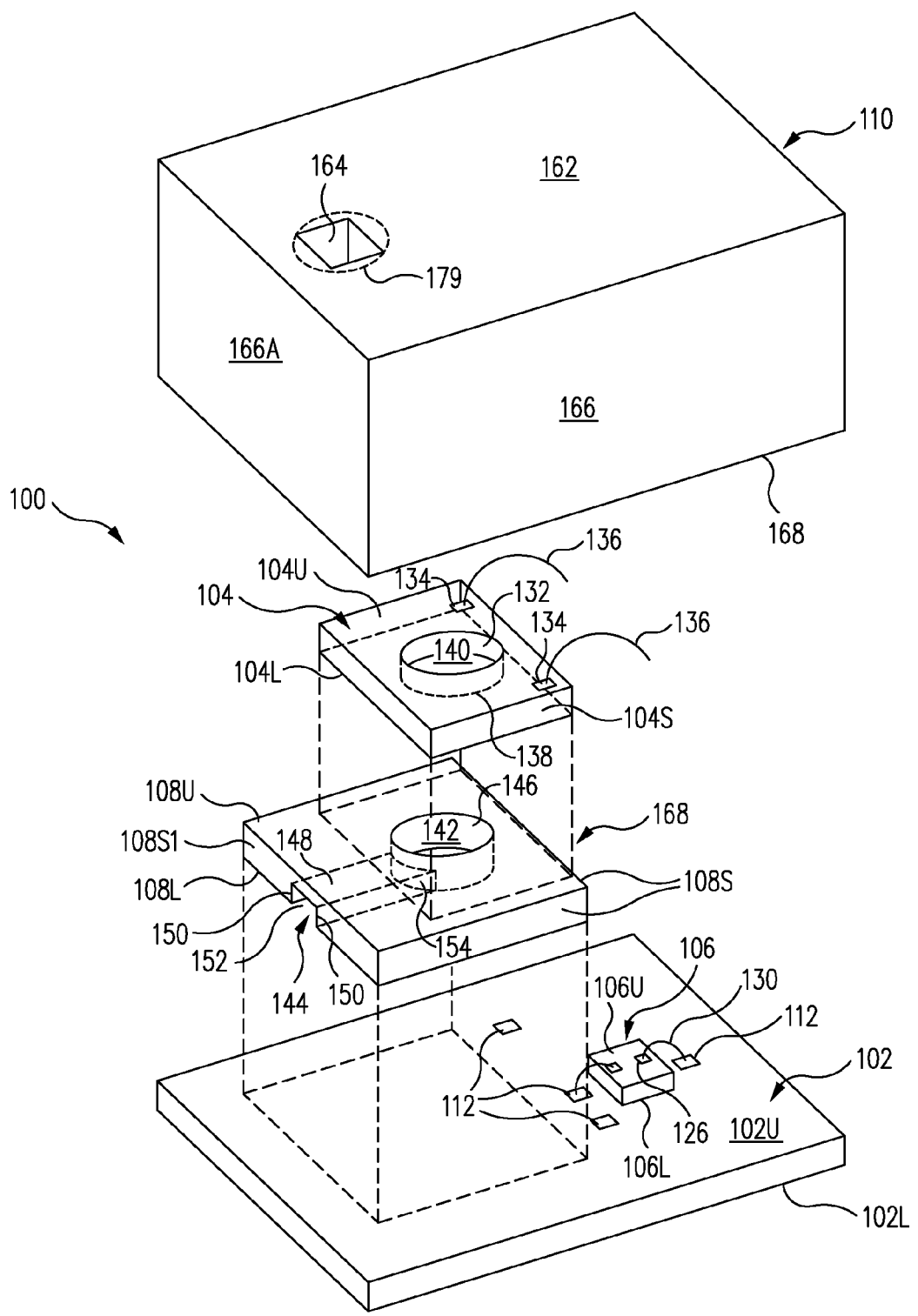
FIG. 2 is an exploded top perspective view of the top port MEMS microphone package of FIG. 1 in accordance with one embodiment.

As an overview and in accordance with one embodiment, referring to FIGS. 1 and 2 together, a top port MEMS package 100 includes a substrate 102 and an interposer 108 mounted to substrate 102. Interposer 108 includes an interposer aperture 142 and an interposer channel 144 fluidly coupled to interposer aperture 142. A MEMS electronic component 104 is mounted to interposer 108 above interposer aperture 142. A top port lid 110 includes a top port 164 and a chimney structure 172 having a flue 176 fluidly coupling top port 164 to interposer channel 144. A front volume 192 including top port 164, flue 176, interposer channel 144, and interposer aperture 142 is acoustically sealed from a relatively large back volume 196 defined by a lid cavity 194 of top port lid 110. By acoustically sealing front volume 192 from back volume 196 and further by maximizing back volume 196, the noise to signal ratio is minimized thus maximizing the sensitivity of top port MEMS microphone package 100 as well as the range of applications.

Now in more detail, FIG. 1 is a cross-sectional view of a top port Micro Electro Mechanical Systems (MEMS) microphone package 100 in accordance with one embodiment. FIG. 2 is an exploded top perspective view of top port MEMS microphone package 100 of FIG. 1 in accordance with one embodiment.

Referring now to FIGS. 1 and 2 together, top port MEMS microphone package 100, sometimes called a top port MEMS package or a plastic cavity laminate package, includes a substrate 102, a MEMS electronic component 104, a converter electronic component 106, an interposer 108, and a top port lid 110.

Substrate 102 includes a dielectric material such as laminate, ceramic, printed circuit board material, or other dielectric material. Formed on an upper, e.g., first, surface 102U of substrate 102 are electrically conductive upper, e.g., first, terminals 112, e.g., formed of copper. Substrate 102 further includes a lower, e.g., second, surface 102L.

Substrate 102 further includes upper, e.g., first, traces 114 formed at upper surface 102U and lower, e.g., second, traces 116 formed at lower surface 102L. Lower traces 116 are electrically connected to upper traces 114 by electrically conductive vias 118 extending through substrate 102 between upper surface 102U and lower surface 102L.

Substrate 102 further includes an upper, e.g., first, solder mask 120 at upper surface 102U that protects first portions of upper traces 114 while exposing second portions, e.g., upper terminals 112, of upper traces 114. Substrate 102 further includes a lower, e.g., second, solder mask 122 at lower surface 102L that protects first portions of lower traces 116 while exposing second portions, e.g., lands 124, of lower traces 116. In one embodiment, lands 124 are distributed in an array thus forming a Land Grid Array (LGA). Alternatively, interconnection balls, e.g., solder balls, are formed on lands 124 thus forming a Ball Grid Array (BGA).

Although a particular electrically conductive pathway is described above, other electrically conductive pathways can be formed. For example, contact metallizations can be formed between the various electrical conductors.

Further, instead of straight though vias 118, in one embodiment, substrate 102 is a multilayer substrate and a plurality of vias and/or internal traces form the electrical interconnection between upper traces 114 and lower traces 116.

Converter electronic component 106 is a conventional converter electronic component, sometimes called an Application Specific Integrated Circuit (ASIC) chip. Accordingly, the features and functions of converter electronic component 106 are well known to those of skill in the art. Thus, only a general description of various features and functions of converter electronic component 106 are set forth below. Generally, converter electronic component 106 converts the signals(s) from MEMS electronic component 104 as required for the particular application.

Converter electronic component 106 includes an upper, e.g., first, surface 106U and an opposite lower, e.g., second, surface 106L. Upper surface 106U is sometimes called an active surface and lower surface 106L is sometimes called an inactive surface. Upper surface 106U includes bond pads 126.

In accordance with this embodiment, converter electronic component 106 is mounted in a wire bond configuration. More particularly, lower surface 106L is mounted to upper solder mask 120 by an adhesive 128. Bond pads 126 of converter electronic component 106 are electrically connected to respective terminals 112 with electrically conductive bond wires 130. Optionally, converter electronic component 106 and/or bond wires 130 are covered with an encapsulant and/or gel coating.

In accordance with another embodiment, converter electronic component 106 is mounted in a flip chip configuration. Illustratively, flip chip bumps, e.g., solder, forms the physical and electrical interconnection between bond pads 126 of converter electronic component 106 and terminals 112 of upper traces 114. Optionally, an underfill is applied between converter electronic component 106 and substrate 102.

In accordance with yet another embodiment, a top port MEMS microphone package is formed without converter electronic component 106. Illustratively, the functionality of converter electronic component 106 is incorporated into MEMS electronic component 104. Accordingly, a separate converter electronic component 106 is unnecessary and not provided.

MEMS electronic component 104 is a conventional MEMS microphone electronic component, sometimes called a MEMS chip. Accordingly, the features and functions of MEMS electronic component 104 are well known to those of skill in the art. Thus, only a general description of various features and functions of MEMS electronic component 104 are set forth below. Generally, MEMS electronic component 104 is an acoustical microphone.

MEMS electronic component 104 includes a lower, e.g., first, surface 104L and an opposite upper, e.g., second, surface 104U. MEMS electronic component 104 further includes sides 104S extending perpendicularly between upper surface 104U and lower surface 104L. Although the terms parallel, perpendicular, and similar terms are used herein, it is to be understood that the described features may not be exactly parallel and perpendicular, but only substantially parallel and perpendicular to within excepted manufacturing tolerances.

MEMS electronic component 104 further includes a moveable compliant diaphragm 132 and bond pads 134 formed at upper surface 104U. Bond pads 134 are electrically connected to respective terminals 112 with electrically conductive bond wires 136. Optionally, one or more of bond pads 134 of MEMS electronic component 104 are electrically connected to respective one or more bond pads 126 of converter electronic component 106 with bond wires 136. Accordingly, bond pads 134 of MEMS electronic component 104 are electrically connected to respective terminals 112, to respective bond pads 126 of converter electronic component 106, or to both respective terminals 112 and respective bond pads 126 of converter electronic component 106. Optionally, bond wires 136 are covered with an encapsulant and/or gel coating.

MEMS electronic component 104 further includes a rigid perforated backplate 138 at lower surface 104L. Backplate 138 is not illustrated in the view of FIG. 1 for simplicity.

MEMS electronic component 104 further includes an aperture 140 extending through MEMS electronic component 104 and between upper surface 104U and lower surface 104L. More particularly, aperture 140 extends between and separates diaphragm 132 and backplate 138 such that diaphragm 132 and backplate 138 form a capacitor.

As described further below, during operation, sound waves move diaphragm 132 thus causing changes in the capacitance between diaphragm 132 and backplate 138. An electrical signal corresponding to the capacitance variations is output on bond pads 134.

Although MEMS electronic component 104 is described above as a MEMS microphone, in other embodiments, MEMS electronic component 104 is another type of MEMS device. For example, MEMS electronic component 104 is a pressure sensor or other MEMS electronic component where access to the ambient environment is required or desired.

Figure 3:
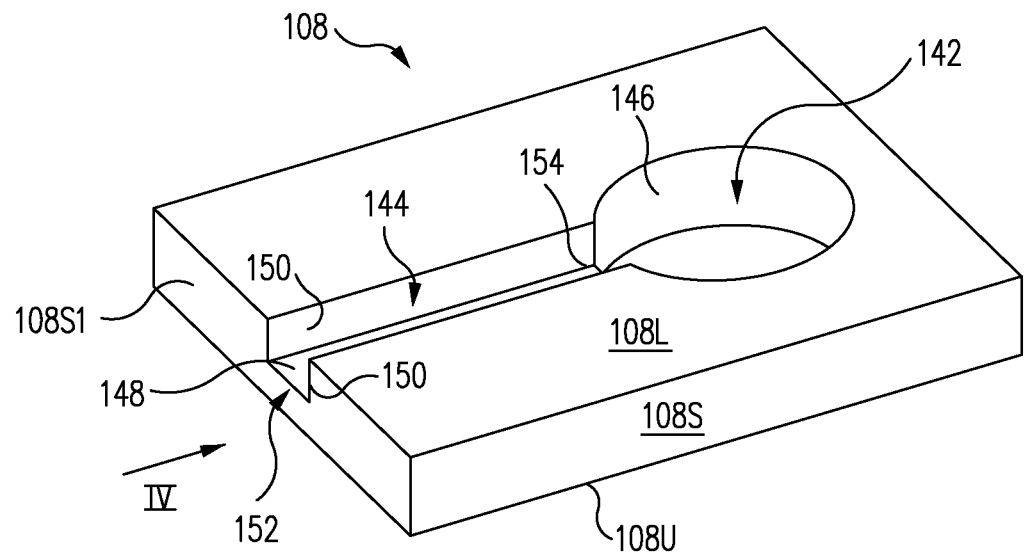
FIG. 3 is a bottom perspective view of an interposer of the top port MEMS microphone package of FIGS. 1 and 2 in accordance with one embodiment.

MEMS electronic component 104 is mounted to substrate 102 by interposer 108. FIG. 3 is a bottom perspective view of interposer 108 of top port MEMS microphone package 100 of FIGS. 1 and 2 in accordance with one embodiment. Note that interposer 108 is inverted in the view of FIG. 3 (i.e., is bottom side up) as compared to the view in FIGS. 1 and 2. Interposer 108 is sometimes called a key hole interposer.

Interposer 108 includes an upper, e.g., first, surface 108U and an opposite lower, e.g., second, surface 108L. Interposer 108 further includes sides 108S extending perpendicularly between upper surface 108U and lower surface 108L. Illustratively, interposer 108 is silicon, printed circuit board, ceramic, laminate, although interposer 108 can be formed of any one of a number of materials.

Interposer 108 further includes an interposer aperture 142 and an interposer channel 144. Interposer aperture 142, sometimes called a key hole interposer acoustic port, extends through interposer 108 in a direction generally perpendicular to and between upper surface 108U and lower surface 108L. Interposer aperture 142 is defined by a generally cylindrical interposer aperture sidewall 146 that extends between upper surface 108U and lower surface 108L. Interposer aperture 142 has a circular cross section in a plane parallel to upper surface 108U and lower surface 108L. However, in other embodiments, interposer aperture 142 has a non-circular cross section, e.g., has an elliptical or polygonal cross section.

Interposer channel 144, sometimes called a groove, a slot, or a cutout, is formed in lower surface 108L of interposer 108. Interposer channel 144 extends in a direction generally parallel to lower surface 108L and between interposer aperture 142 and a first side 108S1 of sides 108S of interposer 108.

Interposer channel 144 is defined by an interposer channel top 148 and interposer channel sidewalls 150. Interposer channel top 148 is generally parallel to lower surface 108L of interposer 108. Interposer channel top 148 is between planes defined by lower surface 108L and upper surface 108U such that interposer 108 remains between interposer channel top 148 and upper surface 108U.

Interposer channel sidewalls 150 extend perpendicularly between lower surface 108L and interposer channel top 148. Although a generally rectangular interposer channel 144 is described above and illustrated in the figures, in other embodiment, interposer channel 144 is a curved or other non rectangular channel.

Interposer channel 144 includes an inlet port 152 and an outlet port 154. Inlet port 152 is formed in side 108S1 of interposer 108. Outlet port 154 is formed in interposer apertures sidewall 146. Interposer channel 144 extends between inlet port 152 and outlet port 154 in a direction perpendicular to side 108S1.

Accordingly, interposer channel 144 is in fluid communication with interposer aperture 142. As used herein, regions are in fluid communication when they are directly connected to one another without an intervening structure such that fluid, e.g., air, and sound can freely move from one region to the other.

Figure 4:
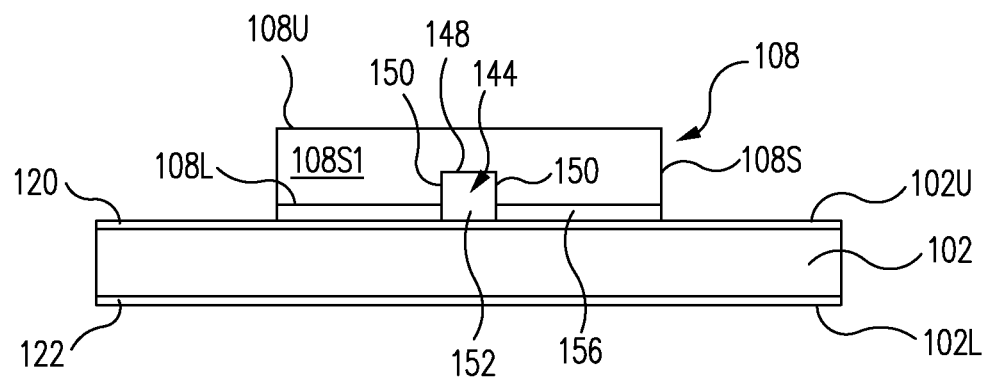
FIG. 4 is a side plan view of the interposer taken along the line IV of FIG. 3 mounted on a substrate of the top port MEMS microphone package of FIGS. 1 and 2 in accordance with one embodiment.

FIG. 4 is a side plan view of interposer 108 taken along the line IV of FIG. 3 mounted on substrate 102 of top port MEMS microphone package 100 of FIGS. 1 and 2 in accordance with one embodiment. Referring now to FIGS. 1, 2, 3, and 4 together, lower surface 108L of interposer 108 is mounted to upper surface 102U of substrate 102, e.g., to upper solder mask 120, by an interposer adhesive 156. Stated another way, interposer 108 is surface mounted to substrate 102.

Accordingly, upper surface 102U of substrate 102 seals interposer aperture 142 and interposer channel 144 at lower surface 108L of interposer 108. However, inlet port 152 of interposer channel 144 remains exposed at side 108S1 of interposer 108. Further, interposer aperture 142 remains exposed at upper surface 108U of interposer 108.

Lower surface 104L of MEMS electronic component 104 is mounted to upper surface 108U of interposer 108 with an adhesive 158, sometimes called a MEMS electronic component adhesive. MEMS electronic component 104 is mounted such that aperture 140 of MEMS electronic component 104 is aligned with and in fluid communication with interposer aperture 142. Generally, MEMS electronic component 104 is mounted to interposer 108 around and directly above interposer aperture 142.

In one embodiment, both interposer 108 and MEMS electronic component 104 are, or include, silicon. In accordance with this embodiment, adhesive 158 is borosilicate glass such that MEMS electronic component 104 is fused to interposer 108. However, adhesive 158 can be other adhesive materials other than borosilicate glass in other embodiments.

Adhesive 158 forms an acoustic seal between MEMS electronic component 104 and interposer 108. More particularly, adhesive 158 forms an acoustic seal around aperture 140 of MEMS electronic component 104 and interposer aperture 142. Accordingly, aperture 140, interposer aperture 142, and interposer channel 144 form a single acoustically sealed cavity 160 that has a single inlet port 152.

Figure 5:
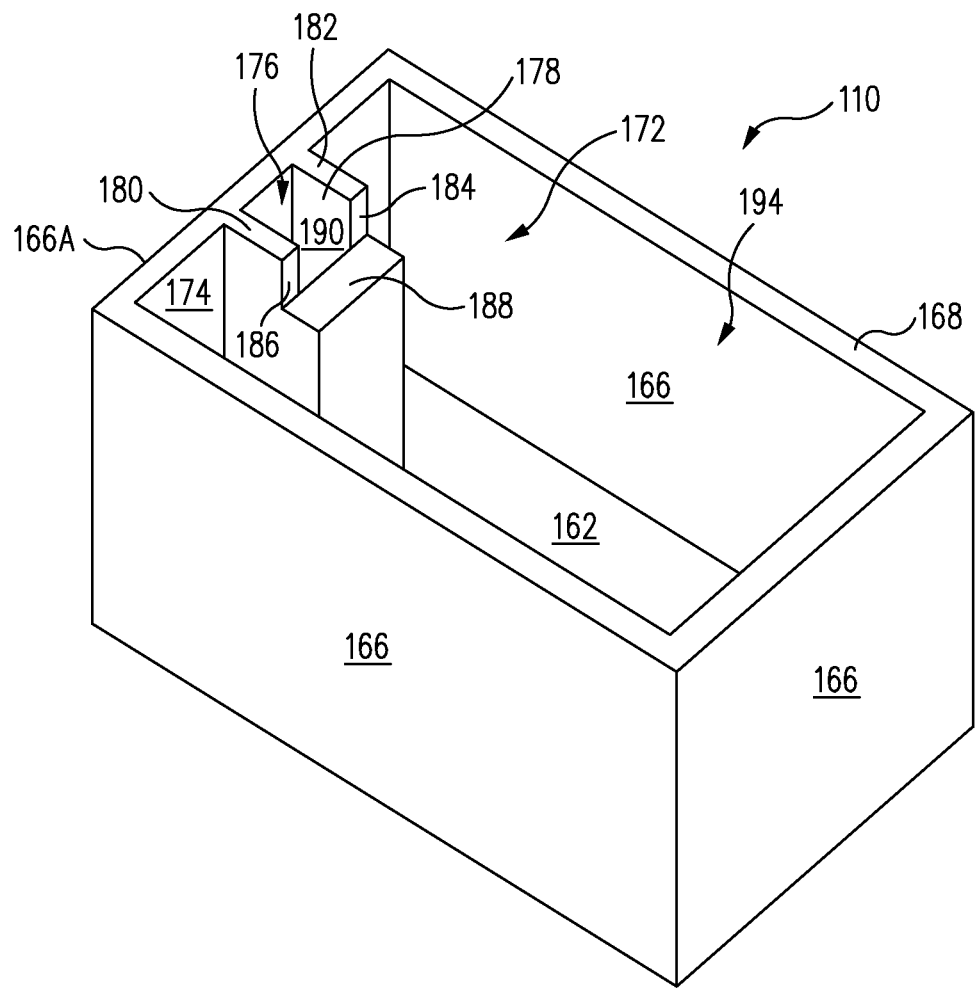
FIG. 5 is a bottom perspective view of a top port lid of the top port MEMS microphone package of FIGS. 1 and 2 in accordance with one embodiment.

FIG. 5 is a bottom perspective view of top port lid 110 of top port MEMS microphone package 100 of FIGS. 1 and 2 in accordance with one embodiment. Note that top port lid 110 is inverted in the view of FIG. 5 (i.e., is bottom side up) as compared to the view in FIGS. 1 and 2.

In one embodiment, top port lid 110 is a build up formed metal impregnated lid, e.g., is electrically conductive. Top port lid 110 is grounded, e.g., by electrically connecting top port lid 110 to a terminal 112 by an electrically conductive adhesive such as lid adhesive 170 discussed below. In accordance with this embodiment, top port lid 110 provides Radio Frequency (RF) shielding. However, in other embodiments, top port lid 110 is non conductive, e.g., is a molded plastic part.

Referring now to FIGS. 1, 2, and 5 together, top port lid 110 includes a lid plate 162 having a top port 164, i.e., an opening, sometimes called a port hole, formed therein. Top port lid 110 further includes lid sidewalls 166 extending downwards from lid plate 162 and terminating at a lid sidewall base 168, e.g., an annular surface parallel to upper surface 102U of substrate 102. Lid sidewall base 168 is mounted to the outer periphery of upper surface 102U of substrate 102, e.g., with a lid adhesive 170, e.g., an electrically conductive or non conductive adhesive such as an epoxy.

Top port lid 110 further includes a chimney structure 172 extending downward from top port 164 of lid plate 162 to lid sidewall base 168 on the inside surface 174 of a first lid sidewall 166A of lid sidewalls 166. Chimney structure 172 includes a flue 176 therein, sometimes called a port hold channel.

Flue 176 is a space, sometimes called an aperture, hole, or channel inside of chimney structure 172. Flue 176 is defined by a flue surface 178 of chimney structure 172. In accordance with this embodiment, flue surface 178 is rectangular as is top port 164. However, in other embodiments such as that discussed below with reference to FIG. 10, flue surface 178 is cylindrical and top port 164 is circular as indicated by the dashed circle 179 in the view of FIG. 2. In any case, top port 164 forms an inlet port for flue 176.

Chimney structure 172 further includes substrate sealing surfaces 180, 182, interposer side sealing surfaces 184, 186, and an interposer upper surface sealing surface 188 as described further below.

Figure 6:
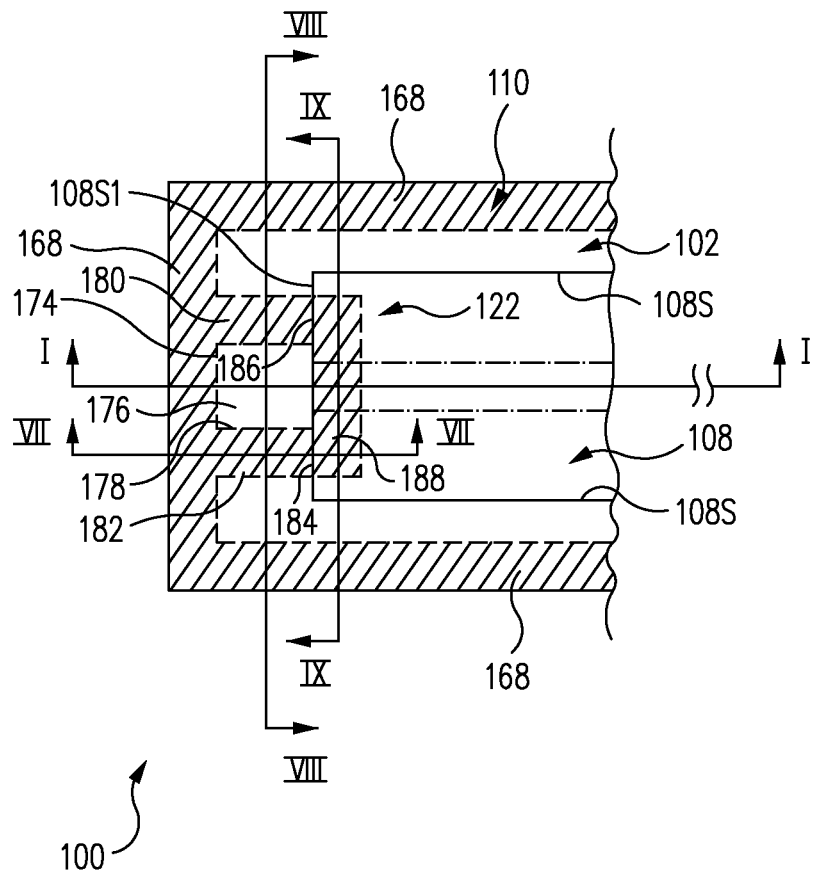
FIG. 6 is a top plan view of the top port lid superimposed upon the substrate and the interposer of the top port MEMS microphone package of FIGS. 1 and 2 in accordance with one embodiment.
Figure 7:
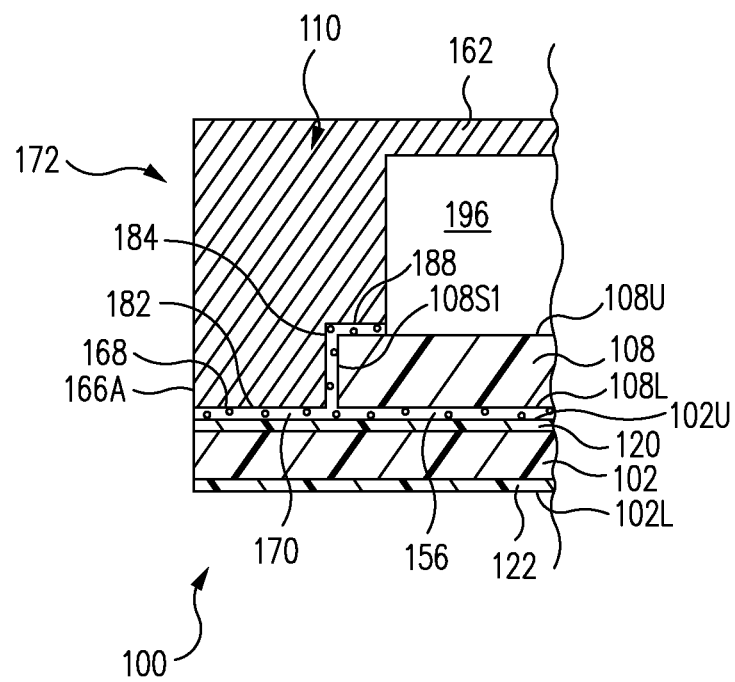
FIG. 7 is a cross-sectional view of the top port MEMS microphone package along the line VII-VII of FIG. 6 in accordance with one embodiment.
Figure 8:
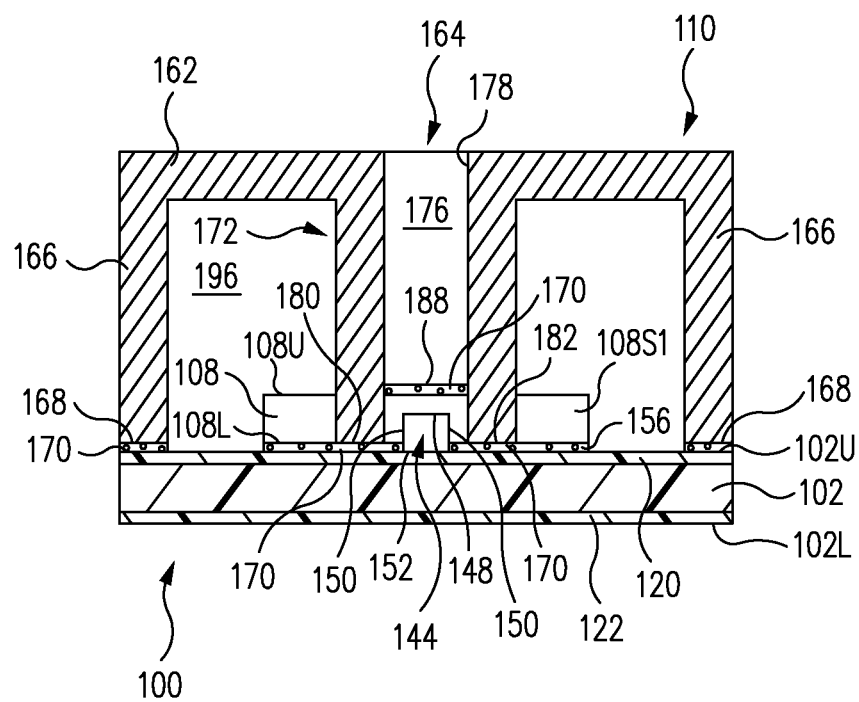
FIG. 8 is a cross-sectional view of the top port MEMS microphone package along the line VIII-VIII of FIG. 6 in accordance with one embodiment.
Figure 9:
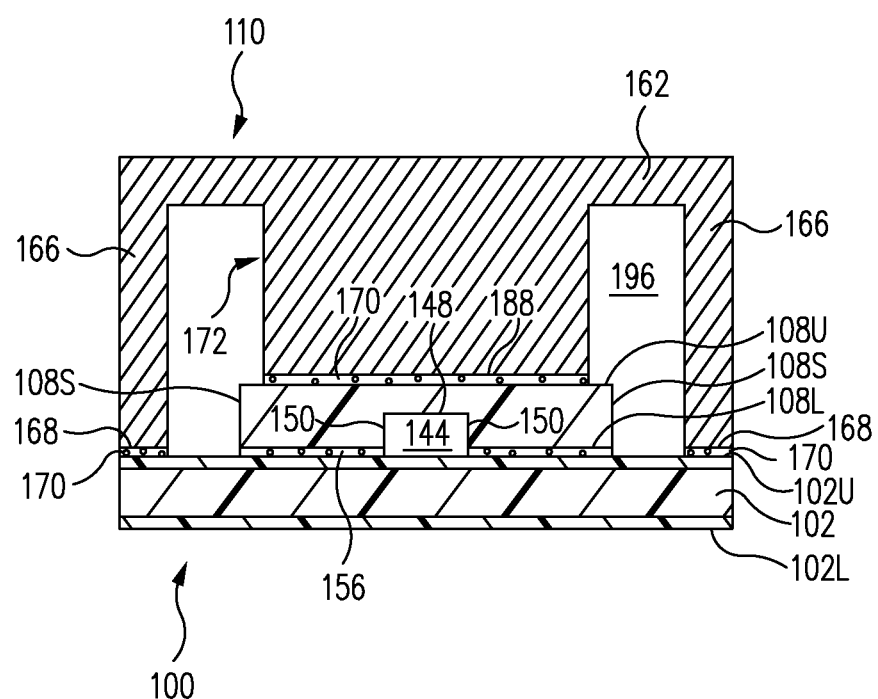
FIG. 9 is a cross-sectional view of the top port MEMS microphone package along the line IX-IX of FIG. 6 in accordance with one embodiment.

FIG. 6 is a top plan view of top port lid 110 superimposed upon substrate 102 and interposer 108 of top port MEMS microphone package 100 of FIGS. 1 and 2 in accordance with one embodiment. FIG. 7 is a cross-sectional view of top port MEMS microphone package 100 along the line VII-VII of FIG. 6 in accordance with one embodiment. FIG. 8 is a cross-sectional view of top port MEMS microphone package 100 along the line VIII-VIII of FIG. 6 in accordance with one embodiment. FIG. 9 is a cross-sectional view of top port MEMS microphone package 100 along the line IX-IX of FIG. 6 in accordance with one embodiment. Note that FIG. 1 is a cross-sectional view of top port MEMS microphone package 100 along the line I-I of FIG. 6 in accordance with one embodiment.

Referring now to FIGS. 1-2, 5-9 together, lid adhesive 170 further mounts chimney structure 172 to substrate 102 and interposer 108 to form an acoustic seal around flue 176 and inlet port 152 of interposer channel 144. More particularly, substrate sealing surfaces 180, 182 are coplanar with and extend perpendicularly inwards from lid sidewall base 168 of lid sidewall 166A. Substrate sealing surfaces 180, 182 are mounted to upper surface 102U of substrate 102 with lid adhesive 170. In one embodiment, substrate sealing surfaces 180, 182 and lid sidewall base 168 are portions of a continuous planar surface that is mounted to upper surface 102U of substrate 102 with lid adhesive 170.

Interposer side sealing surfaces 184, 186 extend perpendicularly upward from substrate sealing surfaces 180, 182, respectively. Interposer side sealing surfaces 184, 186 are mounted to side 108S1 of interposer 108 with lid adhesive 170. Interposer side sealing surfaces 184, 186 are mounted around inlet port 152 such that inlet port 152 is located between interposer side sealing surface 184 and interposer side sealing surface 186. Generally, the region between interposer side sealing surface 184 and interposer side sealing surface 186 is defined as the outlet port 190 of flue 176.

Interposer upper surface sealing surface 188 extends perpendicularly inward from interposer side sealing surfaces 184, 186. Further, interposer upper surface sealing surface 188 extends between interposer side sealing surface 184 and interposer side sealing surface 186 in a direction parallel to lid sidewall 166A of lid sidewalls 166.

Interposer upper surface sealing surface 188 is mounted to upper surface 108U of interposer 108 with lid adhesive 170. Interposer upper surface sealing surface 188 is mounted above inlet port 152. Accordingly, interposer upper surface sealing surface 188 forms a seal with upper surface 108U of interposer 108 above inlet port 152. Further, as described above, interposer side sealing surfaces 184, 186 form seals with side 108S1 of interposer 108 at both sides of inlet port 152.

Thus, outlet port 190 of flue 176 is fluidly coupled to inlet port 152 of interposer channel 144. Further, flue 176 is sealed by lid adhesive 170 between: (1) lid sidewall base 168 of lid sidewall 166A and upper surface 102U of substrate 102; (2) substrate sealing surfaces 180, 182 and upper surface 102U of substrate 102; (3) interposer side sealing surfaces 184, 186 and side 108S1 of interposer 108; and (4) interposer upper surface sealing surface 188 and upper surface 108U of interposer 108.

Accordingly, flue 176 is in fluid communication with inlet port 152. Generally, top port 164 is in fluid communication with diaphragm 132 though flue 176, interposer channel 144, interposer aperture 142, and aperture 140 of MEMS electronic component 104. Stated another way, a front volume 192 is defined by the ambient environment, top port 164, flue 176, interposer channel 144, interposer aperture 142, aperture 140 of MEMS electronic component 104, and diaphragm 132.

More particularly, diaphragm 132 is exposed directly to the ambient environment through top port 164. Accordingly, sound freely travels through top port 164 to contact diaphragm 132.

Generally, a lid cavity 194, i.e., the remaining space inside of top port lid 110, is defined as a back volume 196. More particularly, substrate 102, lid adhesive 170, top port lid 110, interposer 108, MEMS electronic component 104 including diaphragm 132 define back volume 196.

Back volume 196 is a sealed cavity located behind (in back of) diaphragm 132, i.e., back volume 196 is separated from front volume 192 by diaphragm 132. Front volume 192 is acoustically sealed from back volume 196. Further, back volume 196 is much larger than aperture 140 of MEMS electronic component 104. More particularly, back volume 196 is essentially the size of the entire top port MEMS microphone package 100.

By acoustically sealing front volume 192 from back volume 196 and further by maximizing back volume 196, the noise to signal ratio is minimized thus maximizing the sensitivity of top port MEMS microphone package 100 as well as the range of applications.

Further, by using interposer 108 to couple flue 176 to MEMS electronic component 104, dust or other contaminants entering top port 164 is prevented from directly settling on diaphragm 132. Accordingly, loss of sensitivity of top port MEMS microphone package 100 associated with contamination of diaphragm 132 is avoided.

Further, top port MEMS microphone package 100 can be directly mounted to the larger substrate, e.g., a printed circuit motherboard, by lands 124 while still having top port 164 face in an outward direction away from the larger substrate. Stated another way, top port MEMS microphone package 100 can be directly mounted to the larger substrate, e.g., a printed circuit motherboard, by lands 124 while not covering top port 164 with the larger substrate.

Further, assembly of top port MEMS microphone package 100 is relatively simple. Thus top port MEMS microphone package 100 can be manufactured in high volume, e.g., in a High Volume Manufacturing (HVM) environment.

Figure 10:
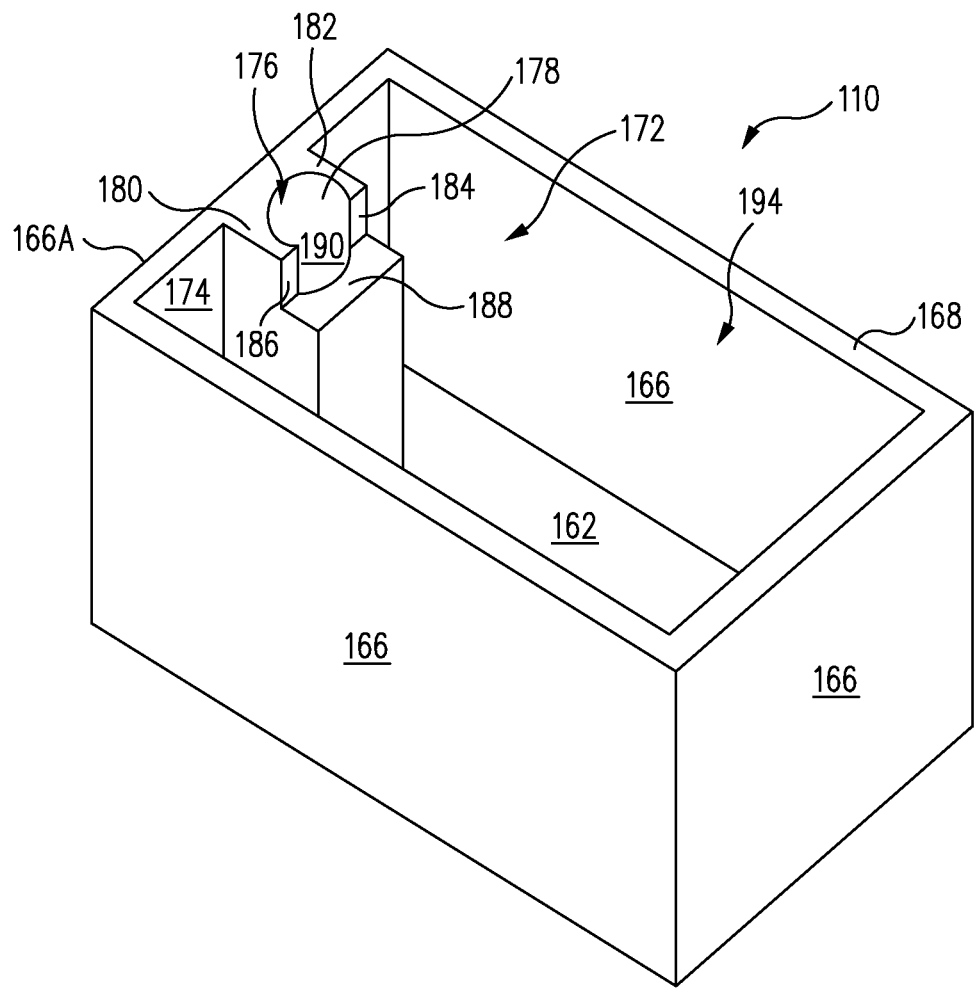
FIG. 10 is a bottom perspective view of the top port lid of the top port MEMS microphone package of FIGS. 1 and 2 in accordance with another embodiment.

FIG. 10 is a bottom perspective view of top port lid 110 of top port MEMS microphone package 100 of FIGS. 1 and 2 in accordance with another embodiment. Note that top port lid 110 is inverted in the view of FIG. 10 (i.e., is bottom side up) as compared to the view in FIGS. 1 and 2.

Referring now FIGS. 2 and 10 together, top port lid 110 includes a cylindrical flue 176 in accordance with this embodiment. More particularly, flue 176 is defined by a cylindrical flue surface 178 that extends between circular top port 164 as indicated by the dashed circle 179 and outlet port 190 of flue 176.

Illustratively, chimney structure 172 is formed as a solid piece during formation of top port lid 110. After formation of chimney structure 172, flue 176 is formed, e.g., by mechanical or laser drilling.

Figure 11:
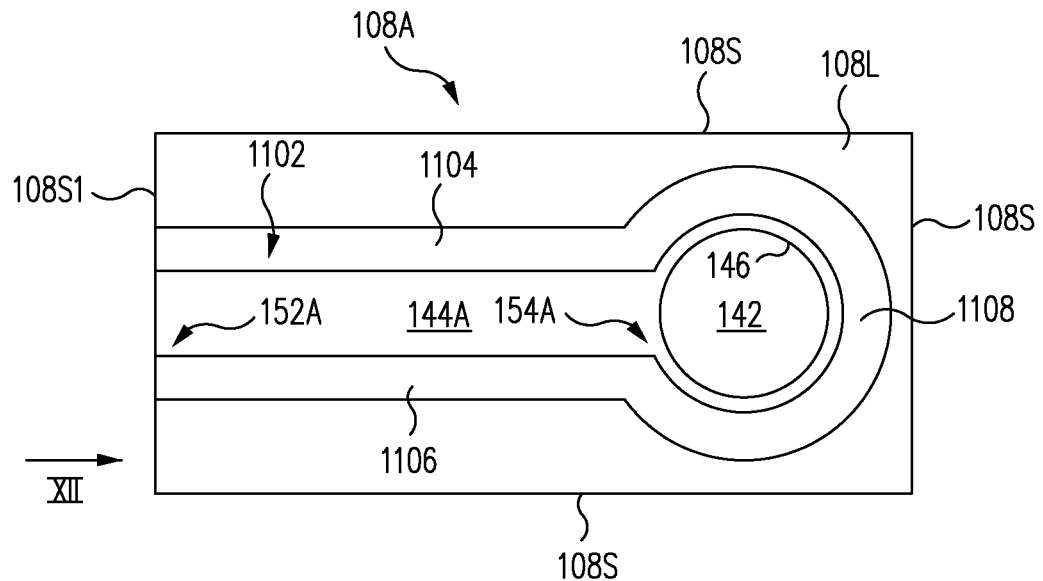
FIG. 11 is a bottom plan view of an interposer of a top port MEMS microphone package in accordance with another embodiment.
Figure 12:
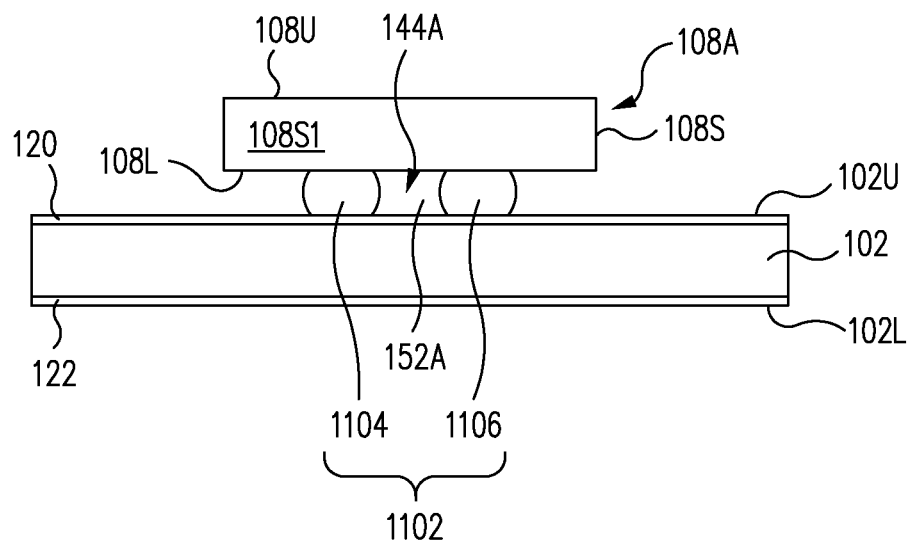
FIG. 12 is a side plan view of the interposer taken along the line XII of FIG. 11 mounted on the substrate of the top port MEMS microphone package of FIGS. 1 and 2 in accordance with one embodiment.

FIG. 11 is a bottom plan view of an interposer 108A of a top port MEMS microphone package in accordance with another embodiment. FIG. 12 is a side plan view of interposer 108A taken along the line XII of FIG. 11 mounted on substrate 102 of top port MEMS microphone package 100 of FIGS. 1 and 2 in accordance with one embodiment.

Referring now to FIGS. 11 and 12 together, note that interposer 108A is inverted in the view of FIG. 11 (i.e., is bottom side up) as compared to the view of interposer 108 in FIGS. 1 and 2. Interposer 108A of FIGS. 11, 12 is similar to interposer 108 of FIGS. 1-4 and only the significant differences are discussed below.

Interposer 108A includes upper surface 108U, lower surface 108L, sides 108S, and interposer aperture 142. Further, interposer 108A includes an interposer channel standoff 1102.

More particularly, interposer channel standoff 1102, sometimes called a solder track, is formed on lower surface 108L of interposer 108A. Lower surface 108L in combination with interposer channel standoff 1102 defines an interposer channel 144A. Interposer channel 144A extends in a direction generally parallel to lower surface 108L and between interposer aperture 142 and a first side 108S1 of sides 108S of interposer 108A.

Lower surface 108L of interposer 108A is mounted to upper surface 102U of substrate 102, e.g., to upper solder mask 120, by interposer channel standoff 1102 of interposer 108A. In one embodiment, interposer channel standoff 1102, e.g., solder, is reflowed to mount interposer 108A to substrate 102.

Interposer channel standoff 1102 is a bead protruding from lower surface 108L. Interposer channel standoff 1102 includes a first linear segment 1104, a second linear segment 1106 and a curved segment 1108.

First linear segment 1104 is parallel to second linear segment 1106. First linear segment 1104 and second linear segment 1106 extend perpendicularly from side 108S1 to be adjacent to, but just short of, interposer aperture 142. Interposer channel 144A is defined by the portion of lower surface 108L between linear segments 1104, 1106, first linear segment 1104, and second linear segment 1106.

Curved segment 1108 is curved, e.g., lies on a circle concentric with interposer aperture 142, and extends between first linear segment 1104 and second linear segment 1106 around interposer aperture 142. Curved segment 1108 forms a seal around interposer aperture 142. In one embodiment, curved segment 1108 defines an outlet port 154A of interposer channel 144A that is in fluid communication with interposer aperture 142. Accordingly, interposer channel 144A is in fluid communication with interposer aperture 142.

Accordingly, upper surface 102U of substrate 102 seals interposer aperture 142 and interposer channel 144A including outlet port 154A at interposer channel standoff 1102 of interposer 108A. However, an inlet port 152A of interposer channel 144A remains exposed at side 108S1 of interposer 108A. Further, interposer aperture 142 remains exposed at upper surface 108U of interposer 108A.

Figure 13:
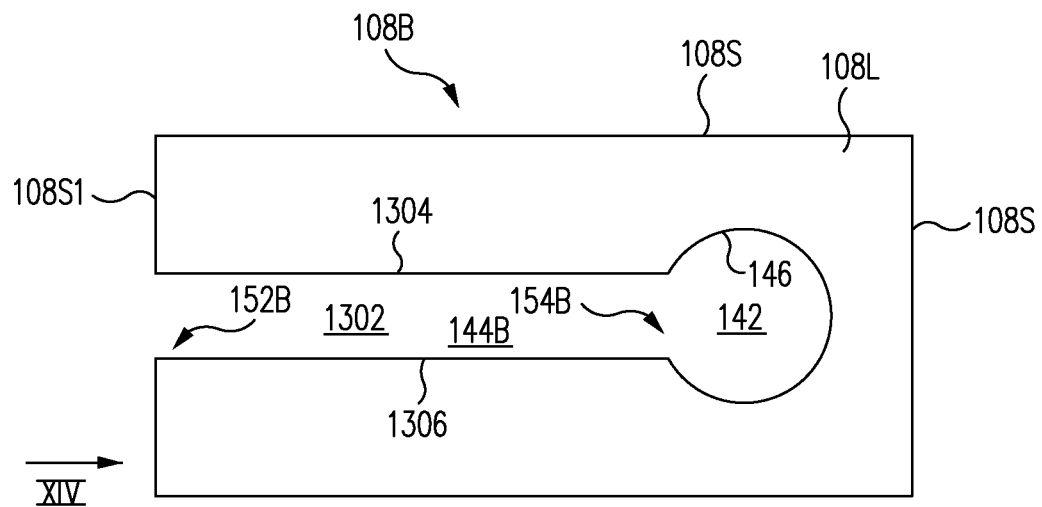
FIG. 13 is a bottom plan view of an interposer of a top port MEMS microphone package in accordance with yet another embodiment.
Figure 14:
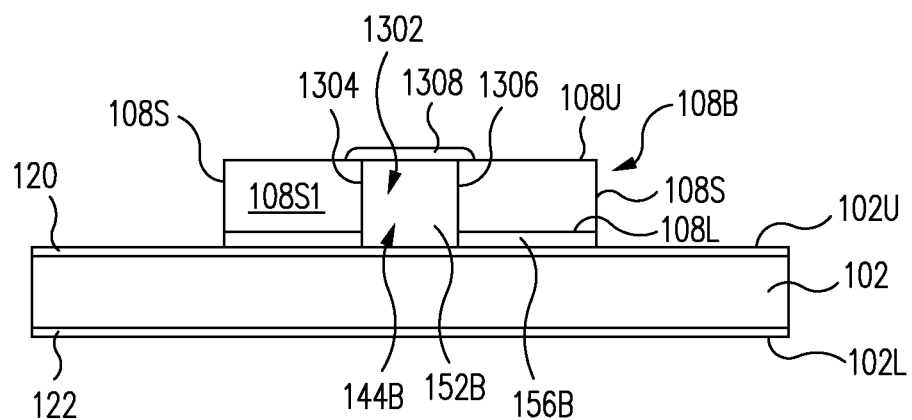
FIG. 14 is a side plan view of the interposer taken along the line XIV of FIG. 13 mounted on the substrate of the top port MEMS microphone package of FIGS. 1 and 2 in accordance with one embodiment.

FIG. 13 is a bottom plan view of an interposer 108B of a top port MEMS microphone package in accordance with yet another embodiment. FIG. 14 is a side plan view of interposer 108B taken along the line XIV of FIG. 13 mounted on substrate 102 of top port MEMS microphone package 100 of FIGS. 1 and 2 in accordance with one embodiment.

Referring now to FIGS. 13 and 14 together, note that interposer 108B is inverted in the view of FIG. 13 (i.e., is bottom side up) as compared to the view of interposer 108 in FIGS. 1 and 2. Interposer 108B of FIGS. 13, 14 is similar to interposer 108 of FIGS. 1-4 and only the significant differences are discussed below.

Interposer 108B includes upper surface 108U, lower surface 108L, sides 108S, and interposer aperture 142. Further, interposer 1083 includes an interposer slot 1302.

More particularly, interposer slot 1302 extends entirely through interposer 108B and between lower surface 108L and upper surface 108U. Interposer slot 1302 is defined by a first interposer slot sidewall 1304 and a second interposer slot sidewall 1306. Interposer slot sidewalls 1304, 1306 extend perpendicularly between upper surface 108U and lower surface 108L. Further, interposer slot sidewalls 1304, 1306 are parallel to one another and extend perpendicularly from a first side 108S1 of sides 108S of interposer 108B to intersect interposer aperture sidewall 146 of interposer aperture 142.

Interposer slot 1302 defines an interposer channel 144B. Interposer slot 1302 and interposer channel 144A extends in a direction generally parallel to lower surface 108L and between interposer aperture 142 and first side 108S1 of sides 108S of interposer 108B. Interposer slot 1302 includes an inlet port 152B at side 108S1 and an outlet port 154B at interposer aperture 142.

Lower surface 108L of interposer 108B is mounted to upper surface 102U of substrate 102, e.g., to upper solder mask 120, by an interposer adhesive 156B. Accordingly, upper surface 102U of substrate 102 seals interposer aperture 142 and interposer slot 1302 of interposer 108B at lower surface 108L. However, inlet port 152B of interposer channel 144A remains exposed at side 108S1. Further, interposer aperture 142 and interposer slot 1302 remain exposed at upper surface 108U of interposer 108B.

Paying particular attention now to FIG. 14, in one embodiment, an interposer slot adhesive 1308, sometimes called a fillet, is applied to seal interposer slot 1302 at upper surface 108U. Illustratively, referring to FIGS. 1 and 14 together, interposer slot adhesive 1308 is a portion of adhesive 158 for mounting of MEMS electronic component 104, a portion of lid adhesive 170, a portion of both adhesives 158, 170, or a completely separate adhesive.

Accordingly, interposer slot 1302 is acoustically sealed at lower surface 108L by substrate 102 and at upper surface 108U by interposer slot adhesive 1308. Interposer slot 1302 is in fluid communication with interposer aperture 142.

Figure 15:
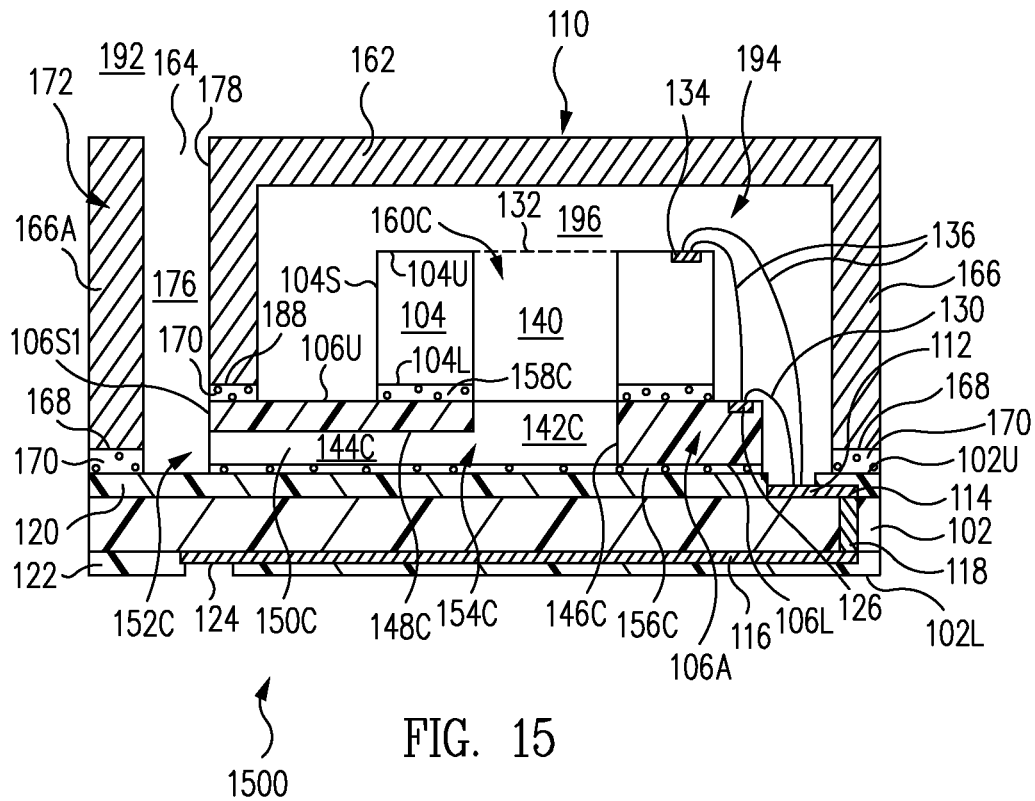
FIG. 15 is a cross-sectional view of a top port MEMS microphone package in accordance with another embodiment.
Figure 16:
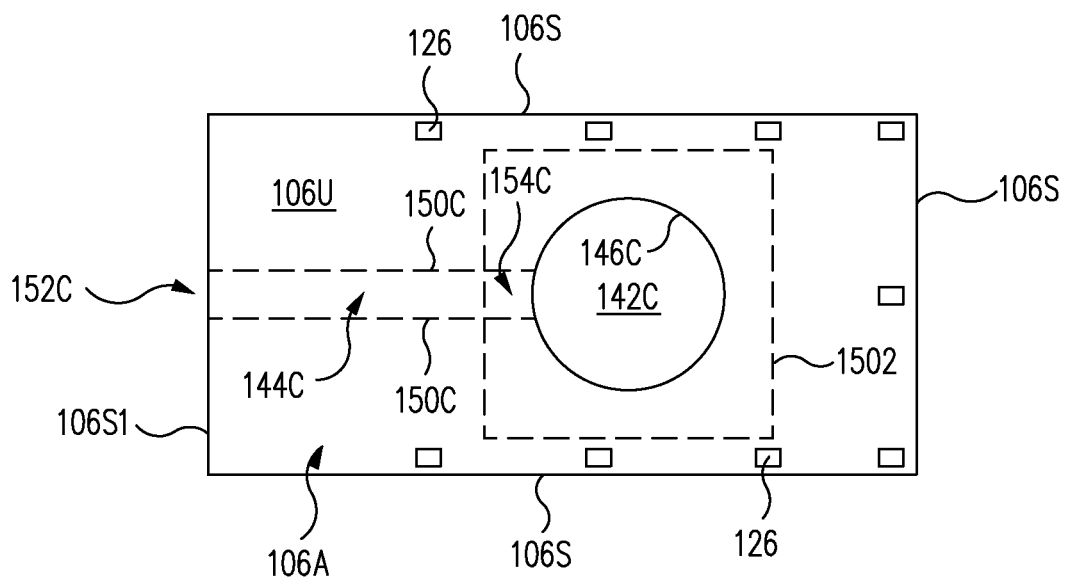
FIG. 16 is a top plan view of a converter electronic component when used as an interposer for the top port MEMS microphone package of FIG. 15 in accordance with one embodiment.

FIG. 15 is a cross-sectional view of a top port MEMS microphone package 1500 in accordance with another embodiment. FIG. 16 is a top plan view of a converter electronic component 106A when used as an interposer for top port MEMS microphone package 1500 of FIG. 15 in accordance with one embodiment. Top port MEMS microphone package 1500 of FIG. 15 is similar to top port MEMS microphone package 100 of FIG. 1 and only the significant differences are discussed below.

Converter electronic component 106A of FIGS. 15, 16 is essentially identical in physical structure to, and used in place of, interposer 108 of FIGS. 1-5. Accordingly, the resultant top port MEMS microphone package 1500 is essentially identical to top port MEMS microphone package 100 of FIGS. 1 and 2 except that converter electronic component 106A takes the place of interposer 108 and a separately mounted converter electronic component 106 as illustrated in FIGS. 1 and 2 is not used.

In the above manner, separate side by side mounting of an interposer such as interposer 108 and a converter electronic component such as converter electronic component 106 of FIGS. 1 and 2 is avoided thus allowing the size of top port MEMS microphone package 1500 to be minimized.

More particularly, converter electronic component 106A of FIGS. 15, 16 has the functionality of converter electronic component 106 of top port MEMS microphone package 100 of FIGS. 1 and 2. Converter electronic component 106A includes bond pads 126 on upper surface 106U.

However, in accordance with this embodiment, converter electronic component 106A is used as the interposer to fluidly couple top port 164 of top port lid 110 to diaphragm 132 of MEMS electronic component 104. Thus, converter electronic component 106A includes an interposer aperture 142C extending entirely through converter electronic component 106A from lower surface 106L to upper surface 106U and an interposer channel 144C formed in lower surface 106L.

Interposer aperture 142C extends through converter electronic component 106A in a direction generally perpendicular to and between upper surface 106U and lower surface 106L. Interposer aperture 142C is defined by an interposer aperture sidewall 146C that extends between upper surface 106U and lower surface 106L.

Interposer channel 144C is formed in lower surface 106L of converter electronic component 106A. Interposer channel 144C extends in a direction generally parallel to lower surface 106L and between interposer aperture 142C and a first side 106S1 of sides 106S of converter electronic component 106A.

Interposer channel 144C is defined by an interposer channel top 148C and interposer channel sidewalls 150C. Interposer channel top 1480 is generally parallel to lower surface 106L of converter electronic component 106A. Interposer channel top 148C is between planes defined by lower surface 106L and upper surface 106U such that converter electronic component 106A remains between interposer channel top 148C and upper surface 106U.

Interposer channel sidewalls 150C extend perpendicularly between lower surface 106L and interposer channel top 148C.

Interposer channel 144C includes an inlet port 152C and an outlet port 154C. Inlet port 152C is formed in side 106S1 of converter electronic component 106A. Outlet port 154C is formed in interposer aperture sidewall 146C. Interposer channel 144C extends between inlet port 152C and outlet port 1540 in a direction perpendicular to side 106S1.

Accordingly, interposer channel 144C is in fluid communication with interposer aperture 142C. Lower surface 106L of converter electronic component 106A is mounted to upper surface 102U of substrate 102, e.g., to upper solder mask 120, by an interposer adhesive 156C.

Accordingly, upper surface 102U of substrate 102 seals interposer aperture 142C and interposer channel 144C at lower surface 106L of converter electronic component 106A. However, inlet port 152C of interposer channel 144C remains exposed at side 106S1 of converter electronic component 106A. Further, interposer aperture 142C remains exposed at upper surface 106U of converter electronic component 106A.

Lower surface 104L of MEMS electronic component 104 is mounted to upper surface 106U of converter electronic component 106A with an adhesive 158C, sometimes called a MEMS electronic component adhesive. MEMS electronic component 104 is mounted such that aperture 140 of MEMS electronic component 104 is aligned with and in fluid communication with interposer aperture 142C of converter electronic component 106A.

Further, as indicated by the dashed MEMS electronic component mounting area 1502 of FIG. 16, MEMS electronic component 104 is mounted to upper surface 106U of converter electronic component 106A inward of bond pads 126. This allows bond pads 126 to be electrically coupled to respective terminals 112, to respective bond pads 134 of MEMS electronic component 104, or to both respective terminals 112 and respective bond pads 134 of MEMS electronic component 104 by bond wires 130 and/or bond wires 136.

Adhesive 158C forms an acoustic seal between MEMS electronic component 104 and converter electronic component 106A. More particularly, adhesive 158C forms an acoustic seal around aperture 140 of MEMS electronic component 104 and interposer aperture 142C of converter electronic component 106A. Accordingly, aperture 140, interposer aperture 142C, and interposer channel 144C form a single acoustically sealed cavity 160C that has a single inlet port 152C.

Inlet port 152C of converter electronic component 106A is coupled to top port 164 by chimney structure 172 of top port lid 110 in a manner similar to that discussed above in reference to coupling of inlet port 152 of interposer 108 to top port 164 by chimney structure 172 of top port lid 110 of top port MEMS microphone package 100 of FIGS. 1 and 2, the discuss of which is incorporated herein.

Converter electronic component 106A is illustrated as including an interposer channel 144C in lower surface 106L in a manner similar to interposer 108 of FIGS. 3, 4. However, in another embodiment, instead of interposer channel 144C, converter electronic component 106A includes an interposer channel standoff similar to interposer channel standoff 1102 of FIGS. 11, 12 on lower surface 106L. In yet another embodiment, instead of interposer channel 144C, converter electronic component 106A includes an interposer slot similar to interposer slot 1302 of FIGS. 13, 14 extending through converter electronic component 106A between lower surface 106L and upper surface 106U.

Figure 17:
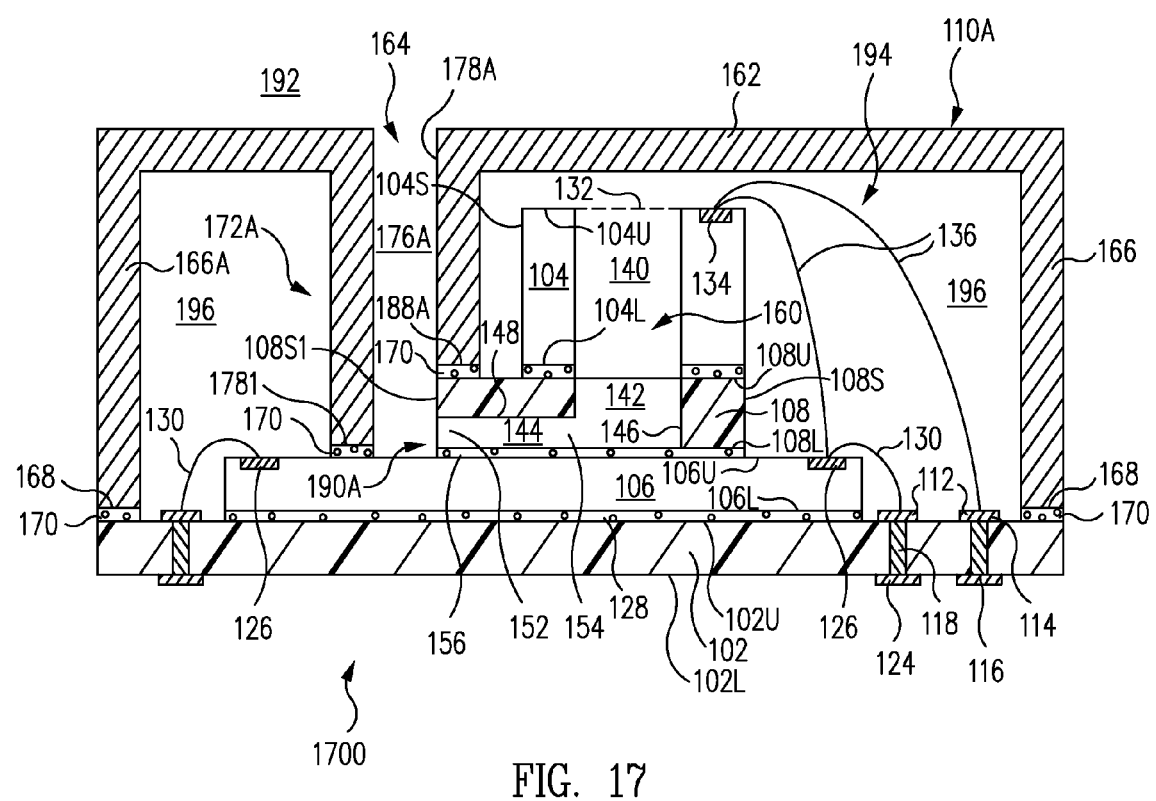
FIG. 17 is a cross-sectional view of a top port MEMS microphone package in accordance with another embodiment.

FIG. 17 is a cross-sectional view of a top port MEMS microphone package 1700 in accordance with another embodiment. Top port MEMS microphone package 1700 of FIG. 17 is similar to top port MEMS microphone package 100 of FIG. 1 and only the significant differences are discussed below.

In accordance with this embodiment, interposer 108 is mounted to converter electronic component 106 which is mounted to substrate 102. Substrate 102 is illustrated without solder masks 120, 122 in FIG. 17 although it is to be understood that substrate 102 includes solder masks 120, 122 in a manner similar to that illustrated in FIG. 1 in other embodiments.

More particularly, lower surface 108L of interposer 108 is mounted to upper surface 106U of converter electronic component 106 inward of bond pads 126 by interposer adhesive 156. Accordingly, upper surface 106U seals interposer aperture 142 and interposer channel 144 at lower surface 108L of interposer 108 in accordance with this embodiment.

Figure 18:
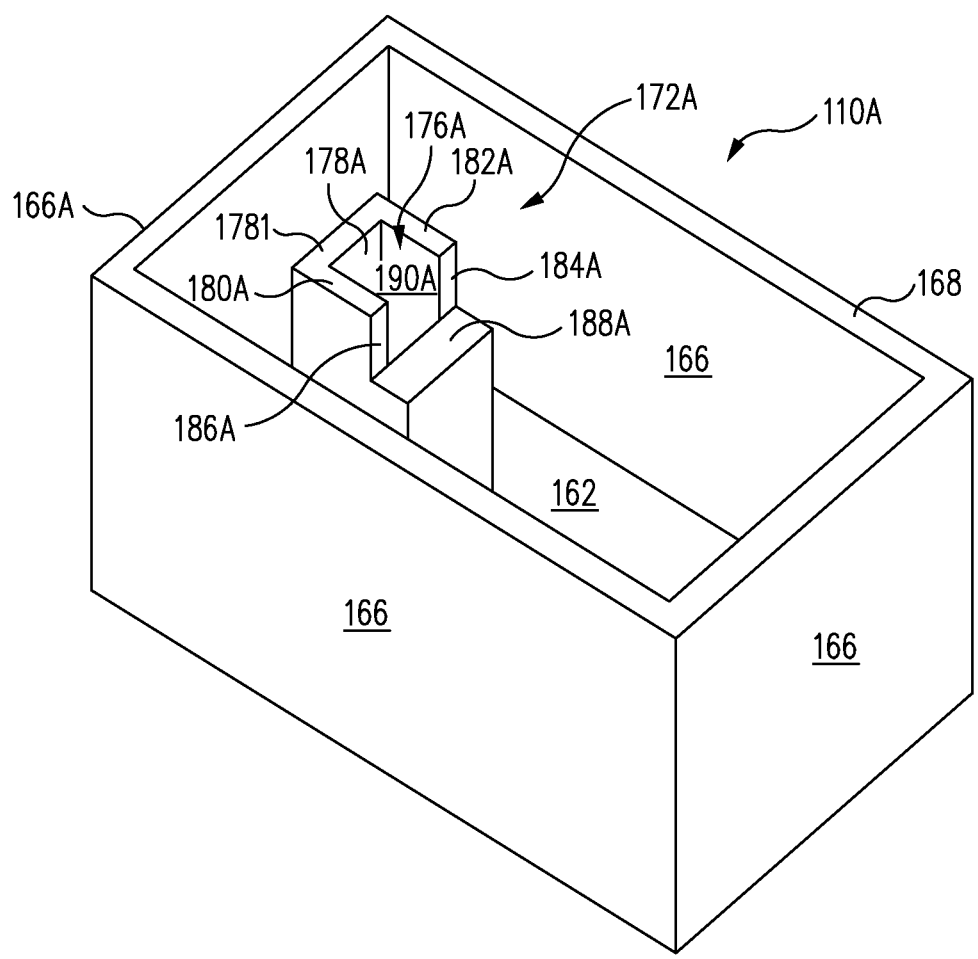
FIG. 18 is a bottom perspective view of a top port lid of the top port MEMS microphone package of FIG. 17 in accordance with one embodiment.

FIG. 18 is a bottom perspective view of a top port lid 110A of top port MEMS microphone package 1700 of FIG. 17 in accordance with one embodiment. Note that top port lid 110A is inverted in the view of FIG. 18 (i.e., is bottom side up) as compared to the view in FIG. 17. Top port lid 110A of FIGS. 17 and 18 is similar to top port lid 110 of FIGS. 1 and 5 and only the significant differences are discussed below.

Top port lid 110A includes lid plate 162, top port 164, lid sidewalls 166, and lid sidewall base 168. Top port lid 110A further includes a chimney structure 172A including a flue 176A having an outlet port 190A coupled to inlet port 152 of interposer 108.

Chimney structure 172A further includes a flue surface 178A, converter electronic component sealing surfaces 1781, 180A, 182A, interposer side sealing surfaces 184A, 186A, and an interposer upper surface sealing surface 188A.

Lid sidewall base 168 is mounted to the outer periphery of upper surface 102U of substrate 102, e.g., with lid adhesive 170. Further, lid adhesive 170 mounts chimney structure 172A to converter electronic component 106 and interposer 108 to form an acoustic seal around flue 176A and inlet port 152 of interposer channel 144.

More particularly, converter electronic component sealing surfaces 1781, 180A, 182A are coplanar with one another, e.g., are parts of a single surface. A plane defined by converter electronic component sealing surfaces 1781, 180A, 182A is between a plane defined by lid sidewall base 168 and a plane defined by lid plate 162 to accommodate the thickness of converter electronic component 106. More particularly, the plane defined by converter electronic component sealing surfaces 1781, 180A, 182A is above the plane defined by lid sidewall base 168 by a distance approximately equal to a thickness of converter electronic component 106, where the thickness is equal to the distance between lower surface 106L and upper surface 106U.

Further, converter electronic component sealing surface 1781 is inward and spaced apart from first lid sidewall 166A of lid sidewalls 166. This space allows for wire bonding with a bond pad 126 located between converter electronic component sealing surface 1781 and first lid sidewall 166A of lid sidewalls 166 as illustrated in FIG. 17.

Converter electronic component sealing surfaces 180A, 182A extend perpendicularly inwards from converter electronic component sealing surface 1781. Converter electronic component sealing surfaces 1781, 180A, 182A are mounted to upper surface 106U of converter electronic component 106 with lid adhesive 170. In one embodiment, converter electronic component sealing surfaces 178I, 180A, 182A are portions of a continuous planar surface that is mounted to upper surface 106U of converter electronic component 106 with lid adhesive 170.

Interposer side sealing surfaces 184A, 186A extend perpendicularly upward from converter electronic component sealing surfaces 180A, 182A, respectively. Interposer side sealing surfaces 184A, 186A are mounted to first side 108S1 of interposer 108 with lid adhesive 170. Interposer side sealing surfaces 184A, 186A are mounted around inlet port 152 such that inlet port 152 is located between interposer side sealing surface 184A and interposer side sealing surface 186A. Generally, the region between interposer side sealing surface 184A and interposer side sealing surface 186A is defined as outlet port 190A of flue 176A.

Interposer upper surface sealing surface 188A extends perpendicularly inward from interposer side sealing surfaces 184A, 186A. Further, interposer upper surface sealing surface 188A extends between interposer side sealing surface 184A and interposer side sealing surface 186A in a direction parallel to lid sidewall 166A of lid sidewalls 166.

Interposer upper surface sealing surface 188A is mounted to upper surface 108U of interposer 108 with lid adhesive 170. Interposer upper surface sealing surface 188A is mounted above inlet port 152. Accordingly, interposer upper surface sealing surface 188A forms a seal with upper surface 108U of interposer 108 above inlet port 152. Further, as described above, interposer side sealing surfaces 184A, 186A form seals with side 108S1 of interposer 108 at both sides of inlet port 152.

Thus, outlet port 190A of flue 176A is coupled to inlet port 152 of interposer channel 144. Further, flue 176A is sealed by lid adhesive 170 between: (1) converter electronic component sealing surfaces 178I, 180A, 182A and upper surface 106U of converter electronic component 106; (2) interposer side sealing surfaces 184A, 186A and side 108S1 of interposer 108; and (3) interposer upper surface sealing surface 188A and upper surface 108U of interposer 108.

Although flue 176A is illustrated as rectangular, in other embodiments, flue 176A has other shapes, e.g., is cylindrical.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A top port Micro Electro Mechanical Systems (MEMS) package comprising:
    a substrate comprising a first planar surface;
    an interposer coupled to the substrate, the interposer comprising:
    an interposer aperture defined by a cylindrical interposer aperture sidewall; and
    an interposer channel fluidly coupled to the interposer aperture, the interposer aperture and the interposer channel being sealed by the first planar surface of the substrate, the interposer channel comprising an outlet port within the cylindrical interposer aperture sidewall;
    a MEMS electronic component coupled to the interposer, the MEMS electronic component comprising an aperture fluidly coupled to the interposer aperture; and
    a top port lid comprising a top port fluidly coupled to the interposer channel, the top port lid comprising a lid sidewall base attached to the first planar surface of the substrate.

2. The top port MEMS package of claim 1 wherein the interposer comprises a first surface and a second surface, the second surface being coupled to the substrate, the interposer aperture extending through the interposer between the first surface of the interposer and the second surface of the interposer.

3. The top port MEMS package of claim 2 wherein the interposer channel is formed in the second surface of the interposer and extends between the interposer aperture and a first side of the interposer.

4. The top port MEMS package of claim 3 wherein the interposer channel is defined by an interposer channel top and interposer channel sidewalls, the interposer channel top being between the first surface of the interposer and the second surface of the interposer, the interposer channel sidewalls extending between the second surface of the interposer and the interposer channel top.

5. A top port Micro Electro Mechanical Systems (MEMS) package comprising:
    a substrate comprising a first planar surface;
    an interposer coupled to the substrate, the interposer comprising:
    a first surface;
    a second surface;
    an interposer channel standoff formed on the second surface of the interposer, the second surface being coupled to the first planar surface of the substrate by the interposer channel standoff;
    an interposer aperture extending through the interposer between the first surface of the interposer and the second surface of the interposer; and
    an interposer channel fluidly coupled to the interposer aperture, the second surface of the interposer and the interposer channel standoff defining the interposer channel, the interposer aperture and the interposer channel being sealed by the first planar surface of the substrate;
    a MEMS electronic component coupled to the interposer, the MEMS electronic component comprising an aperture fluidly coupled to the interposer aperture; and
    a top port lid comprising a top port fluidly coupled to the interposer channel, the top port lid comprising a lid sidewall base attached to the first planar surface of the substrate.

6. The top port MEMS package of claim 5 wherein the interposer channel standoff comprises:
    a first linear segment; and
    a second linear segment parallel to the first linear segment, the first linear segment and the second linear segment extending from a first side to be adjacent to the interposer aperture.

7. The top port MEMS package of claim 6 wherein the interposer channel standoff further comprises:
    a curved segment extending between the first segment and the second segment around the interposer aperture on the second surface of the interposer.

8. A top port Micro Electro Mechanical Systems (MEMS) package comprising:
    a substrate comprising a first planar surface;
    an interposer coupled to the substrate, the interposer comprising:
    a first surface;
    a second surface coupled to the substrate;
    an interposer aperture extending through the interposer between the first surface of the interposer and the second surface of the interposer; and
    an interposer channel fluidly coupled to the interposer aperture, wherein the interposer channel comprises an interposer slot defined by interposer slot sidewalls extending through the interposer between the first surface of the interposer and the second surface of the interposer, the interposer aperture and the interposer channel being sealed by the first planar surface of the substrate;

a MEMS electronic component coupled to the interposer, the MEMS electronic component comprising an aperture fluidly coupled to the interposer aperture; and a top port lid comprising a top port fluidly coupled to the interposer channel, the top port lid comprising a lid sidewall base attached to the first planar surface of the substrate.

9. The top port MEMS package of claim 8 further comprising an interposer slot adhesive sealing the interposer slot at the first surface of the interposer.

10. The top port MEMS package of claim 1 wherein the top port lid comprises a chimney structure fluidly coupling the top port to the interposer channel.

11. The top port MEMS package of claim 10 wherein the chimney structure comprises a flue.

12. The top port MEMS package of claim 11 wherein the flue is cylindrical.

13. The top port MEMS package of claim 10 wherein the chimney structure comprises:

substrate sealing surfaces coupled to the substrate;

interposer side sealing surfaces coupled to a side of the interposer; and an interposer upper surface sealing surface coupled to a first surface of the interposer.

14. The top port MEMS package of claim 13 wherein an inlet port of the interposer channel is located between a first interposer side sealing surface and a second interposer side sealing surface of the interposer side sealing surfaces.

15. The top port MEMS package of claim 1 wherein the interposer comprises a converter electronic component comprising a bond pad on a first surface thereof.

16. A top port Micro Electro Mechanical Systems (MEMS) package comprising:

a converter electronic component comprising a first surface;

an interposer comprising a first surface and a second surface opposite the first surface of the interposer, the second surface of the interposer being coupled to the first surface of the converter electronic component, the interposer comprising:

an interposer aperture; and an interposer channel fluidly coupled to the interposer aperture, the interposer aperture and the interposer channel being sealed by the first surface of the converter electronic component;

a MEMS electronic component coupled to the first surface of the interposer above the interposer aperture;

a top port lid comprising:

a top port; and a chimney structure comprising a flue fluidly coupled to the top port, an outlet port of the flue being fluidly coupled to an inlet port of the interposer channel.

17. The top port MEMS package of claim 16 wherein the MEMS electronic component comprises a moveable diaphragm.

18. The top port MEMS package of claim 17 further comprising:

a front volume comprising an ambient environment, the flue, the interposer channel, the interposer aperture, an aperture of the MEMS electronic component, and the diaphragm; and a back volume acoustically sealed from the front volume, the diaphragm separating the front volume from the back volume.

19. A method comprising:

forming an interposer aperture defined by a cylindrical interposer aperture sidewall and an interposer channel in an interposer, the interposer channel comprising an outlet port within the cylindrical interposer aperture sidewall;

coupling the interposer to a substrate comprising sealing the interposer aperture and the interposer channel by a first planar surface of the substrate;

coupling a Micro Electro Mechanical Systems (MEMS) electronic component to the interposer above the interposer aperture; and attaching a lid sidewall base of a top port lid to the first planar surface of the substrate such that a top port of the top port lid is fluidly coupled to an inlet port of interposer channel.

20. The method of claim 19 wherein sound travels through the top port, through a flue of the top port lid, through the interposer channel, and through the interposer aperture to the MEMS electronic component.

\* \* \* \* \*